(12) United States Patent
Wordeman et al.

(10) Patent No.: US 6,845,059 B1
(45) Date of Patent: Jan. 18, 2005

(54) HIGH PERFORMANCE GAIN CELL ARCHITECTURE

(75) Inventors: Matthew R. Wordeman, Kula, HI (US); John E. Barth, Williston, VT (US); Toshiaki Kirihata, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,109

(22) Filed: Jun. 26, 2003

(51) Int. Cl.[7] ............................................. G11C 8/00
(52) U.S. Cl. .............................. 365/230.05; 365/156
(58) Field of Search .......................... 365/230.05, 154, 365/156, 149, 187

(56) References Cited

U.S. PATENT DOCUMENTS

| | | | | |
|---|---|---|---|---|
| 5,289,432 A | * | 2/1994 | Dhong et al. | 365/230.05 |
| 6,005,795 A | * | 12/1999 | Hawkins et al. | 365/156 |
| 6,016,268 A | * | 1/2000 | Worley | 365/149 |
| 6,262,912 B1 | * | 7/2001 | Sywyk et al. | 365/156 |
| 6,614,696 B2 | * | 9/2003 | Kanno et al. | 365/187 |

* cited by examiner

Primary Examiner—Gene N. Auduong
(74) Attorney, Agent, or Firm—H. Daniel Schnurmann

(57) ABSTRACT

A memory architecture that utilizes single-ended dual-port destructive write memory cells and a local write-back buffer is described. Each cell has separate read and write ports that make it possible to read-out data from cells on one wordline in the array, and subsequently write-back to those cells while simultaneously reading-out the cell on another wordline in the array. By implementing an array of sense amplifiers such that one amplifier is coupled to each read bitline, and a latch receiving the result of the sensed data and delivering this data to the write data lines, it is possible to 'pipeline' the read-out and write-back phases of the read cycle. This allows for a write-back phase from one cycle to occur simultaneously with the read-out phase of another cycle. By extending the operation of the latch to accept data either from the sense amplifier, or from the memory data inputs, modified by the column address and masking bits, it is also possible to pipeline the read-out and the modify-write-back phases of a write cycle, allowing them to occur simultaneously. The architecture preferably employs a nondestructive read memory cell such as 2T or 3T gain cells, achieving an SRAM-like cycle and access times with a smaller and more SER immune memory cell.

23 Claims, 8 Drawing Sheets

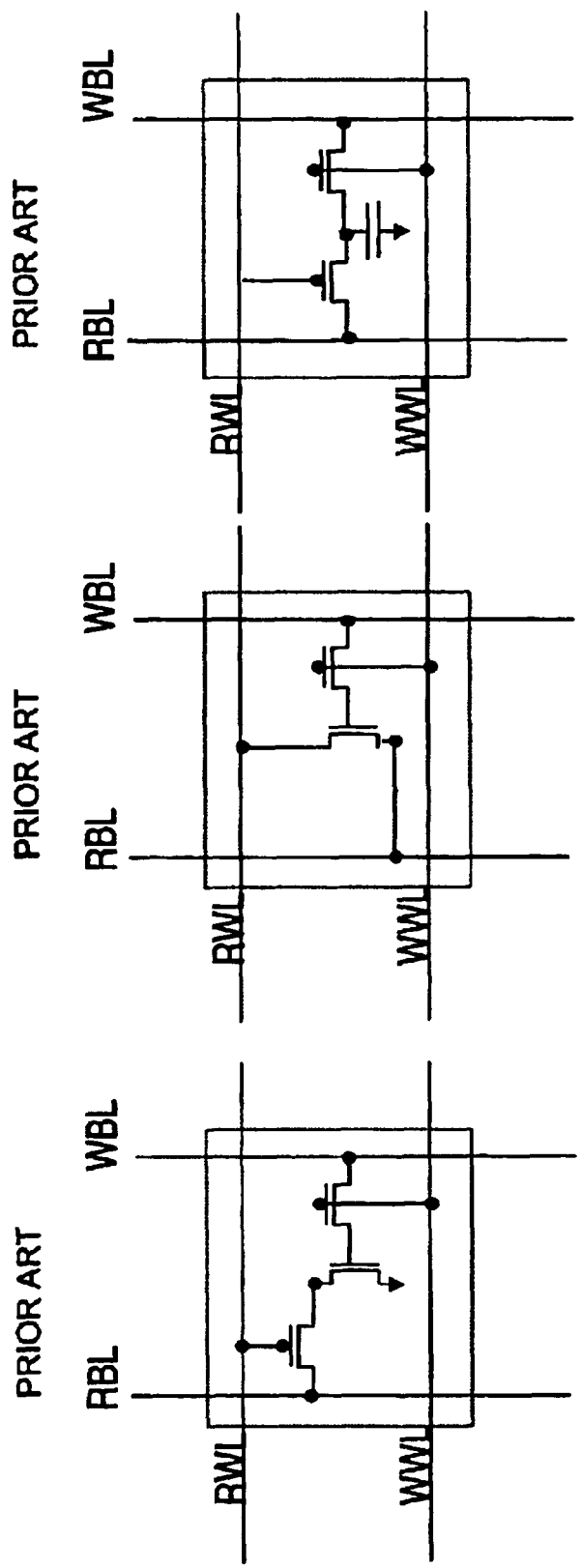

HIGH PERFORMANCE GAIN CELL ARCHITECTURE

BACKGROUND OF INVENTION

This invention generally relates to an embedded dynamic random access memory (embedded DRAM), and more particularly, to a high-performance DRAM architecture utilizing gain cells.

Memory arrays constructed of six transistor static memory cells (6T SRAMs) are generally known to have faster access time and cycle time when compared to single-ended dynamic cells.

FIG. 1A shows a transistor level schematic of a conventional 6T SRAM cell 10 consisting of four NMOS transistors 1, 2, 5, and 6, and two PMOS transistors 3 and 4. PMOS 3 and 4 and NMOS 5 and 6 form a CMOS cross-coupled latch, which maintains a data bit as a storage element. NMOS transistors 1 and 2 couple nodes 7 and 8 to biltlines BL1 and BL2 when activated by wordline WL, allowing the data bit to read to or written from BL1 and BL2. On the other hand, single-ended dynamic cells are known to be smaller and benefit from significantly reduced soft-error-rate at small geometries.

FIG. 2A is a transistor level schematic of a conventional single-ended dynamic cell 20. It consists of one NMOS transistor 21 and capacitor 22 (1T DRAM cell). When the wordline WL is activated, NMOS 21 couples capacitor 22 to the bitline BL, allowing the data bit stored in capacitor 22 to be read to or written from BL.

Several reasons exist to explain the difference in performance. From a functional standpoint, the SRAM cell 10 shown in FIG. 1B can be described as one having three signal connections attached to each cell consisting of one storage element and two switches 11 and 12. These are: wordline (WL) and bitlines 1 (BL1) and 2 (BL2). Cells are arranged in a matrix formation with a wordline connecting a plurality of cells in one direction and bitlines in an orthogonal arrangement. Switches 11 and 12 are controlled by wordline WL such that storage element 15 can be accessed by bitlines BL1 and BL2. Data is preserved in the SRAM cell for many cycles as long as power is maintained, and as long as the wordline servicing the cells is not activated. In a non-activated condition, because switches 11 and 12 are opened, the SRAM cell presents a high impedance to the BL1 and BL2 connections. When the wordline is activated, switches 11 and 12 couple storage element 15 to bitlines BL1 and BL2. As a result, the SRAM cell displays a different impedance to bitlines BL1 and BL2 depending upon the state of the memory cell. For a cell storing a logic '1', BL1 displays a lower impedance than BL2 at an impedance value that is slightly less than that in the non-activated case. A logic "1" represents the condition necessary for the CMOS cross-coupled latch in FIG. 1A to maintain a "0" and "1" at nodes 7 and 8, respectively.

Assuming that BL1 and BL2 are precharged to VDD, the impedance of NMOS switch 1 in FIG. 1A is lower than that of NMOS switch 2. For a cell storing a '0', bitline_2 port will have a lower impedance than the bitline_1 port which, in turn, will display an impedance that is slightly less than the non-activated case. Thus, a "0" is the state wherein the CMOS cross-coupled latch maintains a 1 and 0 at nodes 7 and 8, respectively. Assuming having BL1 and BL2 precharged to VDD, then, NMOS switch 2 impedance is lower than the impedance of NMOS switch 1. This difference in impedances can be used to sense the state of the memory cell using one of several existing techniques. The state of the static memory cell is not disturbed by reading it; hence it is known to have a non-destructive read-out (NDRO). The cell is written by asserting the wordline while forcing a reference voltage on bitline_1 to write one state, or by forcing a reference voltage on bitline_2 to write the other state. If no bitline is forced (or if both are forced to the same direction), the cell will not be written, but instead will maintain its previous state. This is known as a non-destructive write (NDW).

The aforementioned characteristics are used to enhance performance using the following techniques since the read-out operation is nondestructive and the bitlines may be precharged back to their 'ready' state while the wordline is still activate. This characteristic makes it possible to reduce the time of a random access cycle. When a read-out is nondestructive, it is possible to multiplex several bitlines into a single sense amplifier, allowing the use of a larger area for each sense amplifier, and hence more complex, higher performance circuits. Moreover, since bitlines produce differential signals from each cell, the bitline signal is 'self-referenced', essentially reducing noise, improving the signal/noise ratio, and allowing a faster amplification of the signal. Furthermore, since the SRAM cell develops an impedance difference when read, it is possible to use current sensing techniques to sense the signal. These are known to be faster than voltage sensing techniques (traditionally used to sense dynamic cells) particularly for arrays having many bits per bitline. Since the SRAM cell can be read nondestructively (NDRO), the cell need not be written-back after it is read-out (as compared to traditional dynamic cells). Also, because the SRAM cell enables a nondestructive write (NDW), it is possible to perform a write operation only for selected cells even if more cells are activated by the corresponding wordline. Unselected data bits are typically maintained by floating bitlines (or by forcing both bitlines to high). Accordingly, the non-destructive read (NDRO) and non-destructive write (NDW) features have the most significant impact on the cycle time of a conventional DRAM cell array when compared to an SRAM cell.

From a functional standpoint, the single ended dynamic cell 20 can be described as one having two signal connections attached to each cell including one storage element 22 and one switch 21 (FIG. 2B). The connections are: wordline (WL) and bitline (BL). Because of the nature of the dynamic cell, when WL is activated, data in the storage element is destroyed (destructive read). The destroyed data needs then to be written back into the storage element increasing the read cycle time. Because of the write back requirement, DRAMs typically use a CMOS cross-coupled sense amplifier SA. Additionally, the write cycle time is equal or slower than the read cycle time, unless all the bits coupled to the wordline are simultaneously written. This may be explained by the fact that unselected cells for the write operation are destroyed in a manner similar to the destructive read operation, requiring a sensing and write back operation (read modified write), necessitating a longer write cycle time.

Accordingly, it is important to solve these two problems to enable the SRAM like cycle time. Techniques are known to utilize a destructive read/destructive write 1T1C DRAM cell in combination with a write-back buffer array to realize a dynamic memory with cycle time that approaches that of an SRAM. One known technique is a memory architecture in which the read-out of one DRAM array occurs simultaneously with the write-back operation in a separate DRAM array of the same memory. A buffer array is used to resolve data conflicts. Data management techniques inherent to this solution, however, tend to increase the access time. Hence it is difficult to use such a technique to achieve an SRAM-like access time.

FIG. 3A shows a prior art single-ended multi-port destructive write memory cell 30 consisting of a storage element 33 and two switches (31 and 32). The single ended multi port destructive write memory cell is characterized by having four wires connected to each cell:

a read bitline (RBL) traversing the array in one direction, a write bitline (WBL) traversing the array in a direction parallel to the read bitline;

a read wordline (RWL) traversing the array of cells in a direction orthogonal to the bitlines;

and a write wordline (WWL) traversing the array of cells in a direction parallel to the read wordline.

Data is stored in the cell for as many cycles as necessary as long as the read wordline and write wordline are not activated. The cell displays high impedance at its read bitline port as long as the read wordline is not activated. When the read wordline RWL is activated, the switch 30 couples storage element 33 to read bitline RBL. This enables the nondestructive read cell to provide an impedance to the read bitline (RBL) which depends on the logic value stored in a cell similar to the 6T SRAM cell. This occurs in the class of single-ended multi-port cells which have nondestructive read-out.

FIGS. 3B-3C show conventional nondestructive read and destructive write memory cells comprising three transistors (3T cell) and two transistors (2T cell), respectively, or a destructive read cell such as one having a single capacitor, wherein the storage element shares the charge that it is stored in the capacitor in the read bitline (RBL). This occurs in the class of single-ended multi-port cells which have destructive read-out.

FIG. 3D shows a prior art destructive read and destructive write memory cell consisting of two transistors and one capacitor (2T 1C cell).

Regardless whether a 3T, 2T, or 2T 1C cells are used, when a write wordline is activated, the cell takes on the logic state that is forced onto the write bitline by opening switch 32 (FIG. 3A), coupling it to the write BL (WBL). Every cell which is connected by a write wordline being activated is written into. There is no option for activating a wordline and having the cell maintain its previous state because of a destructive write. Therefore, it is required to write all the bits coupling to the activated WWL simultaneously. Otherwise, the write cycle time is limited by the read modify write back operation similar to the DRAM. However, writing all the bits along the wordline concurrently requires rearranging the data lines and associated drivers with the same periodicity as the memory cells. Such a solution requires significant area and hence is expensive. Also, the number of cells coupled to a wordline must be equal or less than the number of the write data bits. This requirement is not practical for a "narrow" I/O organization, such as x 16, or even for x 32 or x 64. Using a single-ended multi-port non-destructive write memory cell may overcome the problem. However, it requires at least an equal number, or preferably, more transistors than the conventional 6T SRAM cell and is, therefore, undesirable for being expensive.

In a typical destructive read array, the read cycle consists of a read-out, a write-back and a precharged phase. In the conventional destructive write array, all the data bits coupled to a wordline are simultaneously written. Otherwise, the write cycle consists of a read-out, a modify-write-back and a precharged phase (read modified write). Hence the typical operation of a single-ended destructive write multi-port memory cell ends up having a longer cycle than that of a nondestructive read /write 6T SRAM.

SUMMARY OF INVENTION

It is an object of the invention to provide a memory formed with single-ended multi-port destructive write memory cells.

It is another object to provide a memory architecture that makes it possible to have a write-back phase from one cycle to occur simultaneously with the read-out phase of another cycle.

The foregoing and other objects of the invention are realized by a circuit and an architecture that utilize single-ended dual-port destructive write memory cells and a local write-back buffer. Each cell has separate read and write ports that make it possible to read-out data from cells along one wordline in the array, and immediately thereafter write-back data to the same cell while simultaneously cells on another wordline in the array are being read-out. Thus, by implementing an array of sense amplifiers such that one amplifier is coupled to each read bitline, and a latch receiving the result of the sensed data and delivering this data to the write bitlines, it is possible to 'pipeline' the read-out and write-back phases of the read cycle. This allows for a write-back phase from one cycle to occur simultaneously with the read-out phase of another cycle.

By extending the operation of the latch to accept data either from the sense amplifier, or from the memory data inputs, modified by the column address and masking bits, it is also possible to pipeline the read-out and the modify write-back phases, allowing them to occur simultaneously for different wordlines. The architecture preferably employs a nondestructive read memory cell such as 2T or 3T gain cells, achieving an SRAM-like cycle and access times with a smaller and more SER immune memory cell.

Alternatively, the architecture is provided with a destructive read memory cell such as a 2T 1C cell, which achieves the same performance with a destructive read architecture employed in other, known destructive read architectures, but with a simpler destructive read scheduling.

In a first aspect of the invention, there is provided an array of memory cells, respectively coupled to read and write bitlines, each read bit line being attached to a read sensing circuits, and each write bitlline connected to a write drivers, a latch and a multiplexer, as described above. A series of write wordlines connect the write activation ports on many cells in a manner that is orthogonal to the read and write bitlines. Similarly a series of read wordlines connects the read activation port on many cells in an orthogonal arrangement to the read and write bitlines. Read and write wordlines are asserted by a wordline decoder and driver circuits in such a manner so that one read wordline and one write wordline can be asserted simultaneously.

In a second aspect of the invention, the row decoder circuit is augmented by a latch located at each decoder output. Using this latch, the row decoder can first select a read wordline for activation. The wordline selection is stored in the latch so that the decoder is free to select the next read wordline while the last latched wordline selection is used to activate the write wordline.

The sequence of events to perform a read operation of the above array of memory cells is as follows: i) row address decoding; ii) read wordline assertion; iii) read data transfer from the selected memory cells to the read bitlines; iv)

detection of the data on the read bitlines by the read sense circuits; v) transfer of the digital data from the read sense circuits both to the readout port of the memory array and to the latch associated with the read bitline; and vi)de-assertion of the read wordline.

The sequence of events to perform a write operation in the above array of memory cells is as follows: i) row address decoding; ii)read wordline assertion; iii) read data transfer from the selected memory cells to the read bitlines; iv) detection of the data on the read bitlines by the read sense circuits; v) transfer of the digital data from the read sense circuits to the latch associated with the read bitline; vi) de-assertion of the read wordline and transfer of the wordline selection to the write wordline latch; vii) logical combination of data in the read bitline latch with input signals such as column addresses, mask bit and data bits to form the appropriate state presented to the write bitline driver; viii) write wordline assertion using the wordline indicated in the wordline selection latch; ix) driving the write bitlines with the calculated write bits; x) modification of the memory cell based on the data on the cells write port; and xi) de-assertion of the write wordline and clearing of the wordline selection latches.

A "pipeline" operation of the memory array is such that some or all of the operations vii) to xi) of the write cycle operating at one wordline address may overlap, i.e., they occur concurrently with operations i) to vi) of the write cycle, or operations i) to vi) of the read cycle at a different wordline address.

The aforementioned memory array may also operate in a mode where the memory cells are read-out destructively. In this case, a read or a refresh cycle includes the same operation steps as the write cycle previously described, except for operation vii) which does not accept signals from outside the array, such that data from the read sense circuits is not modified before being delivered to the write driver. Additionally, some or all of operations vii) to xi) of the write cycle operating and one wordline address may overlap in time with operations i) to vi) of the refresh or read cycle. Also some or all of operations vii) to xi) of the refresh cycle may overlap with operations i) to vi) of the refresh cycle, and operations i) to vi) of a write cycle or operations i) to iv) of the read cycle.

BRIEF DESCRIPTION OF DRAWINGS

The accompanying drawings, which are incorporated in and which constitute a part of the specification, illustrate presently preferred embodiments of the invention and, together with the general description given above and the detailed description of the preferred embodiments given hereinafter serve to explain the principles of the invention.

FIGS. 3B and 3C respectively show typical prior art nondestructive read and destructive write memory cells consisting of 3 transistors (3T cell) and 2 transistors (2T cell).

DETAILED DESCRIPTION

Figure 4:
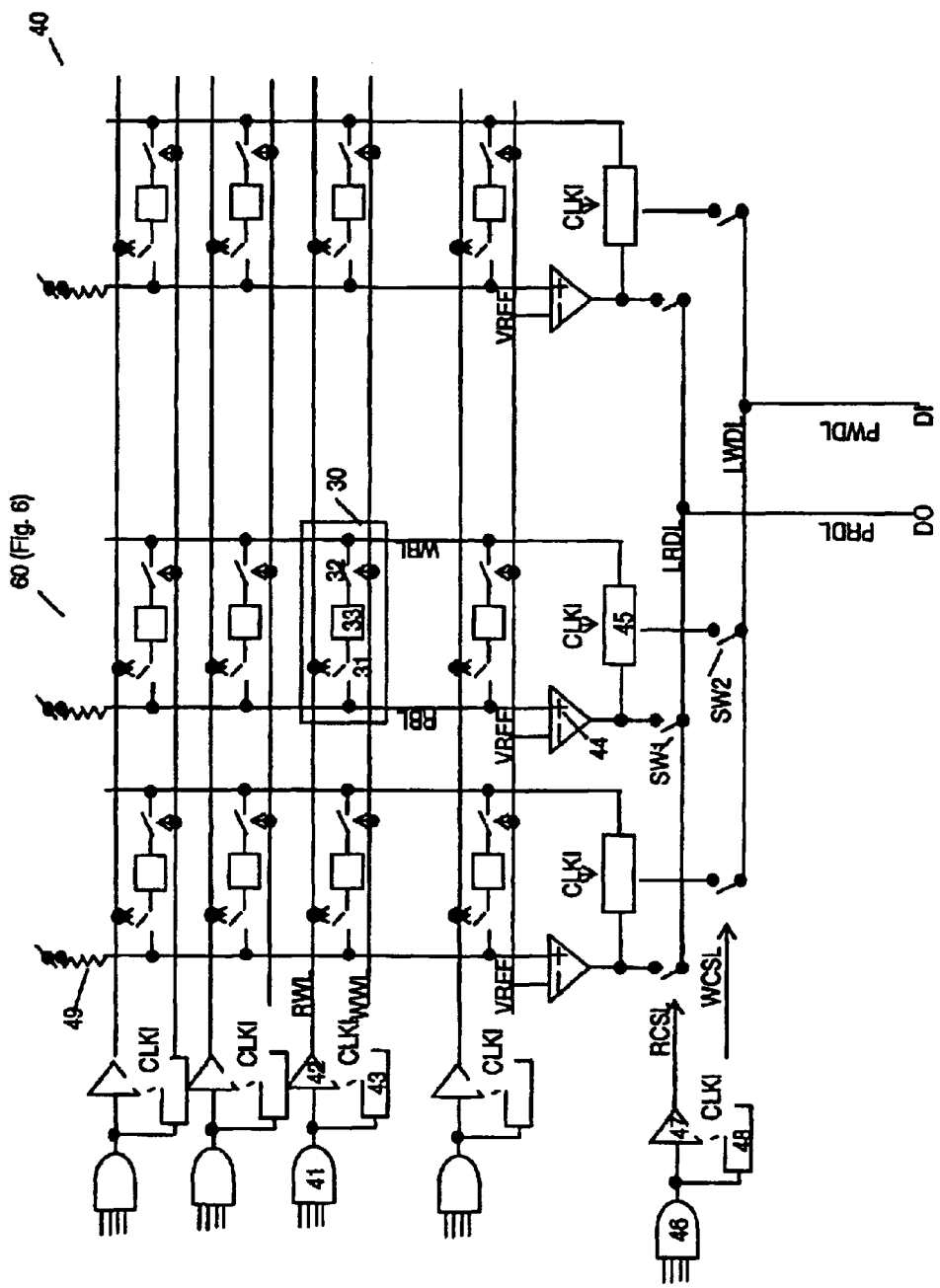
FIG. 4 shows a single ended destructive write multi-port memory array architecture consisting of a plurality of a single ended destructive write multi-port memory cells, each including a read port, a write port and a storage element, according to the present invention.

FIG. 4 shows a single-ended destructive write multi-port memory array architecture, according to the present invention. The memory architecture 40 includes a plurality of single-ended destructive write multi-port memory cells 30, each consisting of a read port 31, a write port 32, and a storage element 33. The cells are organized in a matrix formation by way of a plurality of rows, each coupled to the read wordline RWL and write wordline WWL, and a plurality of columns, each coupled to read bitline RBL and to write bitline WBL. Each RWL and WWL is supported by a common row decoder 41, a read wordline driver 42, and write wordline latch and driver 43. Alternatively, each read and write wordline drivers 42 and 43 have an independent row decoder 41. Each read bitline RBL is supported by a read sense amplifier 44 and a precharged device or resistor 49, and each write bitline WBL, by bitline write circuit 45. A common column decoder 46 services a read column select driver 47 and a write column select driver 48. Alternatively, each read and write column select drivers 46 and 47 are provided with an independent column decoder 46.

The discussion following hereinafter assumes a synchronous pseudo-SRAM interface, which supports read, write, and refresh operations at each clock cycle.

Read Mode:

When a read command is given at which time the system clock CLK switches to high, the row decoders 41 and column decoders 46 enable, respectively, the corresponding read wordline driver 42 and read column select driver 47. The respective RWL thus switches to high, and opens read ports 31 of the corresponding memory cells 30. As a result, data bits in the appropriate memory cells 30 are read out to the corresponding RBLs. Concurrently, signal read column select RCSL switches to high, opening read column switch 31, allowing the corresponding read sense amplifier 45 to couple to the local read data line LRDL. Read BL precharged device 49 is preferably kept on for current sensing of the non-destructive memory cell. However, it may be turned off during RWL activation to conserve power. Alternatively, it may be turned off prior to activating RWL for a destructive read memory cell. Regardless whether a non-destructive read memory cell or a destructive read cell, a current mode sense amplifier 44 is preferably used, although the present invention is not limited to only this configuration.

Sense amplifier 44 senses the data bit generated in each RBL, which is then automatically transferred to LRDL and PRDL, allowing an SRAM-like access behavior, particularly, if a non-destructive read cell is used.

For a destructive read memory cell, the destructive read operation is preferably used for creating a preconditioned write by choosing a proper BL precharged voltage, such as VDD or ½VDD. For a write-back operation following the read-out, the sensed data bits are transferred to write buffer 45, which occurs when delayed clock CLKI switches to high. When this occurs, the write wordline latch and driver 43 activates the corresponding WWL. When a transition to high takes place, WWL opens the corresponding write ports 32 of memory cells 30. Concurrently, write bitline driver 45 drives the read data bits to WBL, allowing the read data bit to be transferred from read port 31 of memory cell 30 to be written back to write port 32 of the memory cell through RBL and WBL, and within two cycles. As long as each read and write cycle is equal or less than the clock cycle, the next read command will be accepted as a "pipeline" allowing a single cycle read access time. Alternatively, for a non-destructive read array, the write back cycle may be disabled to save power.

Write mode:

When a write command is given at which time the system clock CLK switches to high, row decoders 41 and column decoders 46 enable the appropriate read wordline driver 42. The corresponding RWL thus switches to high, and opens read ports 31 of the corresponding memory cells 30. As a result, data bits in the matching memory cells 30 are read out to the corresponding RBLs. The read BL precharged device 49 may be kept on, preferably, for current sensing of the nondestructive memory cell. However, it may be turned off during the activation of RWL to conserve power. Alternatively, one may turn it off prior to activating RWL, i.e., in an instance of a destructive read memory cell. Regardless whether a destructive read memory cell or non-destructive read cell, current mode sense amplifier 44 senses the data bit developed on each RBL. The read-out data is transferred to the write data latch 45.

Concurrently, write data bits are driven to the primary write data line (PWDL) and local write data line. At the same time, the CLKI enables a write column select driver 48, activating the signal WCSL. The activation of the WCSL transfers the write data bit from the LWDL to the selected write bitline circuit 45, overriding the data from the read sense amplifier. When the CLKI switches to high, the write wordline driver 43 asserts the corresponding WWL. Switching WWL to high opens the corresponding write ports 32 of the memory cells 30 enabling a simultaneous write back to cells on un-selected columns and write to cells on the selected columns.

Optionally, by integrating the disable function of the WCSL with a mask bit control, the write bits end up also masked. This is well known in the art and, consequently, will not be discussed further. The foregoing allows the write data bit driven from WPDL to be written to a write port of the same memory cell, keeping the destructive write memory cell deselected by transferring the data bits form the read port of the memory cell to the write port of the same memory cell via RBL and WBL over two cycles. As long as each read or each write cycle is equal or less than the clock cycle, the next read command can be accepted as a "pipeline", to allow a single write access cycle.

Refresh Mode:

When a refresh command is given at which time a system clock CLK switches to high, row decodes 41 enables the corresponding read wordline driver 42. The corresponding RWL switches to high, opening read ports 31 of the corresponding memory cells 30. As a result, data bits in the corresponding memory cells 30 are read out to the corresponding RBLs. The read BL precharged device 49 may preferably be kept on for current sensing of a non-destructive memory cell. However, it may be turned off during RWL activation to conserve power. Alternatively, it may be turned off prior to activating RWL for a destructive read memory cell. Regardless whether a destructive read memory cell or a non-destructive read cell are used, a current mode sense amplifier 44 may be utilized, although the invention is not limited in this configuration.

The current mode sense amplifier 44 senses the data bit generated on RBL. This makes it possible to achieve an SRAM-like access performance, particularly, if a non-destructive read cell is employed. For a destructive read memory cell, a destructive read operation is preferably used for creating a preconditioned write by selecting the appropriate BL precharged voltage, such as VDD or ½VDD. For the write back operation following the read-out mode, the sensed data bits are transferred to the write buffer 45 when the delayed clock CLKI switches to high. When CLKI switches to high, write wordline driver 43 activates the corresponding WWL. Switching WWL to high opens the corresponding write ports 32 of the memory cells 30. Simultaneously, write bitline driver 45 drives the read data bits to WBL. This allows the read data bit that was transferred from the read port of the memory cell to be written back to the write port of the same memory cell through the RBL and the WBL within two cycles. As long as each read or write cycle is equal less than the clock cycle, the next read command can be accepted as a pipeline allowing a single cycle refresh access cycle time.

The concepts discussed above will now be more clearly understood by way of the following preferred embodiment applicable to a prior art 3T gain cell.

Figure 5:
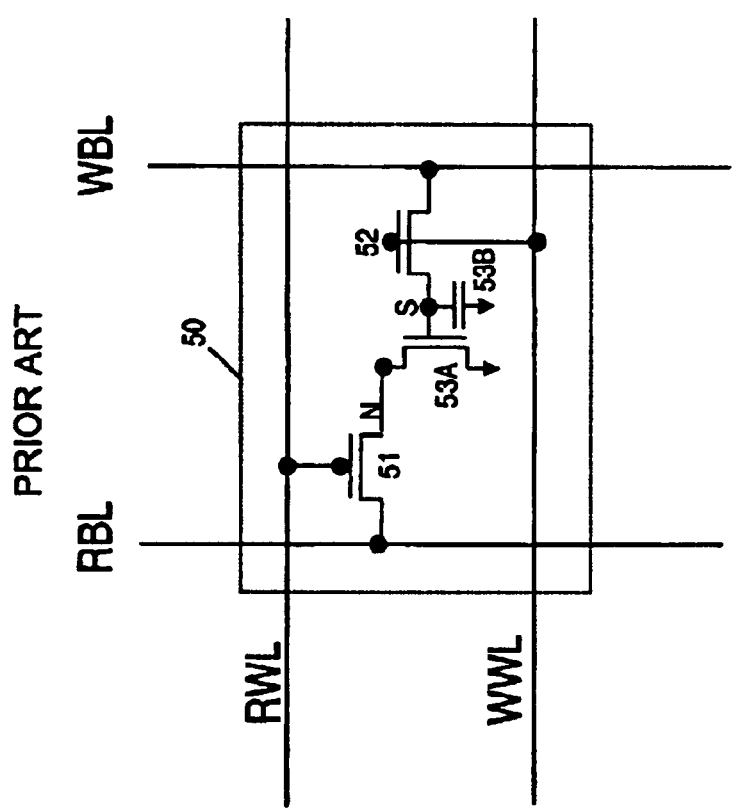
FIG. 5 shows how the concepts of the present invention apply to a prior art 2-port 3T gain cell by enabling a non-destructive read and a destructive write operation.

FIG. 5 shows a conventional 2-port 3T gain cell that enables a non-destructive read and a destructive write operation. The 3T gain cell 50 consists of three NMOS transistors 51, 52 and 53A. A data bit is maintained by gate capacitor 53A as a storage element. Optionally, an additional capacitor 53B may be integrated to improve the data retention time. The data bit at the node S can be read-out to the read bitline RBL when the read wordline RWL coupled to the gate of NMOS31 switches to high. Maintaining node S to high discharges RBL. If node S is at low, RBL remains in a high state. When write wordline WWL switches to high, the source node S becomes coupled to write bitline WBL. Thus, the data bits at the node S can be changed by WBL.

Figure 6:
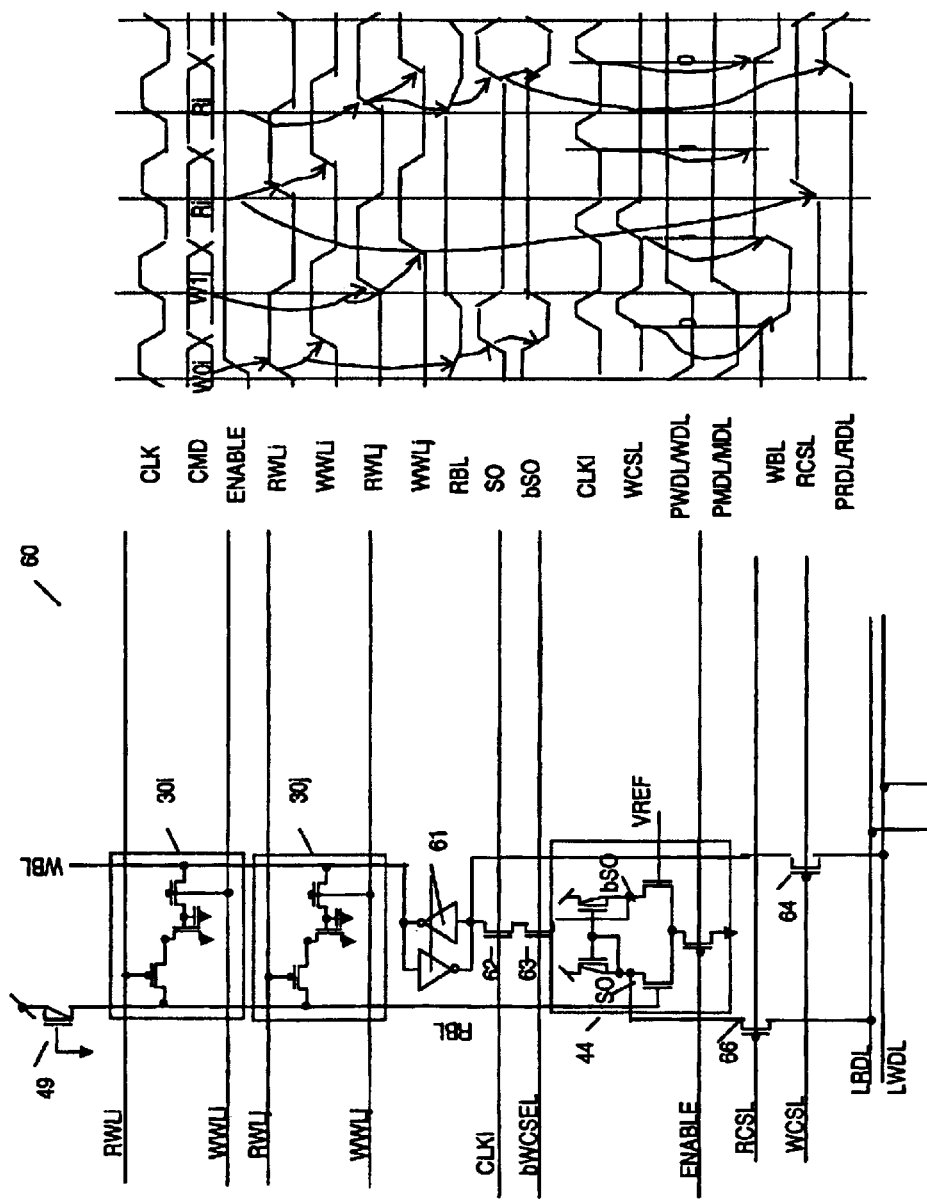
FIG. 6A is a transistor level schematic of a column shown in FIG. 4, with each column consisting of a plurality of 3T memory cells coupled to a plurality of RWL and WRL pairs, and one RBL and WBL pair, according to the invention.
FIG. 6B shows the internal timing diagram for several commands, i.e., write 0 for memory cell i (W0i), write command 1 for the memory cell j (W1j), read memory cell i (Ri) and read memory cell j (Rj).

FIG. 6A is a transistor level schematic diagram of the column shown in FIG. 4. Each column 60 consists of a plurality of 3T memory cells 30i and 30j (FIG. 3) coupled to a plurality of RWL-WWL pairs and one RBL-WBL pair (FIG. 4). A read bitline RBL is precharged to VDD by PMOS 49. When RWL switches to high, RBL remains at high if node S is at 0, or it may discharge a few hundred millivolts from VDD. The RBL voltage level is determined by the conductance ratio between PMOS 49 and the 3T cell memory cell. A current mirror sense amplifier 44 (FIG. 4) compares RBL to a reference voltage VREF, which is set at a level half-way between VDD and the voltage to which RBL discharges to. If the voltage at RBL is higher than VREF, nodes SO and bSO are then, respectively kept at 0 and 1. If the RBL is lower than VREF, nodes SO and bSO will switch to 1 and 0, respectively. The current mirror sense amplifier 44 is enabled when signal ENABLE switches to high. A signal RCSL activates read column switch 66 to transfer the data bit from the current mirror sense amplifier 44 to the local read data line LRDL. It is preferably driven in order to transfer a signal to the primarily read data line PRDL. The signal transfer to the PRDL occurs immediately following RWL being activated. This allows an SRAM like read access performance. Bitline write circuit 61 includes a simple CMOS latch which is driven either by the current mirror sense amplifier 44 when both write column switches 62 and 63 are closed, or by the data on the LWDL line when the write column switch 64 closes. In a read or data refresh modes, write column select signal WCSL and bWCSL remain, respectively, at low and high. When the delayed clock CLKI switches to high, the node bSO at sense amplifier 44 drives CMOS latch 61, allowing the sensed result to be transferred to WBL. CLKI is preferably generated by sensing the state of cells in a dummy column in the array which is identical to a regular column in every what except the cells are pre-conditioned so that they will always store a "1" data state. The RBL in the dummy column, therefore, discharges when the RWL switches to high, which generates signal CLKI and guarantees the data bits to be ready for the write back operation to all cells on the wordline.

Two situations exist for a write cycle. For the selected columns, WCSL switches to high, allowing write BL circuit 61 to be driven by LWDL. Note that the write path from the current mirror sense amplifier 44 is disabled by bWCSL. For the unselected columns, write BL circuit 44 is driven by the corresponding current mirror sense amplifier 44, allowing the sensed data bits to be written back to the corresponding memory cells. Optionally, the data mask function may be integrated by disabling the WCSL selection. This is well known in the art, and will not be discussed further.

FIG. 6B shows the internal timing diagram for the given commands write 0 for memory cell i (W0i), write command 1 for the memory cell j (W1j), read memory cell i (Ri) and read memory cell j (Rj). It is assumed that memory cells 0 and 1 originally store 1 and 0, respectively.

The "pipelined" write followed by read architecture described above works well if the consecutive addresses are different. In view of the non-destructive read nature, two consecutive read commands (or read and write) for the same row address can also be serviced because the memory cells are forced by the same data bits read out from the same cell. For two consecutive write commands for the same row address, the BL write circuit should only be updated by the write command by forcing bWCSL while enabling WCSL. A write followed by a read for the same row address requires special data handling. Since the read-out and modify-write-back operations associated with the write cycle are pipelined, the bits written are not yet stored in the memory cell when the next read command is issued. Note that this is the only concern for the updated write bits, whereas other unselected write bits provide the same operation as a read mode. Consequently, a problem occurs only when the row and column addresses are exactly the same as for the previous write command.

Figure 7:
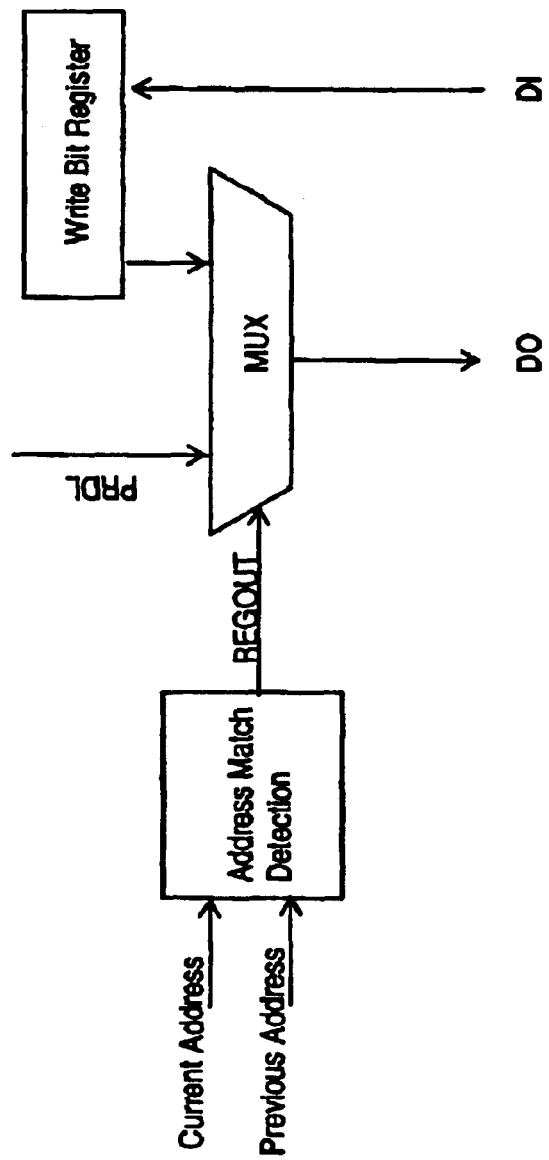
FIG. 7 shows a block diagram consisting of an address match detection circuit, a write bit register and a multiplexer.

FIG. 7 is a block diagram of an address match detection circuit, write bit register and multiplexer. The address match detection compares the address input with the previous address, and generates a signal REGOUT that remains at 0 if no match occurs, allowing the read data bits to be read from the memory array. If a match occurs, the signal REGOUT switches to high, allowing the data bits to be read out from the register which has been loaded by the write data of the last command.

Figure 1B:
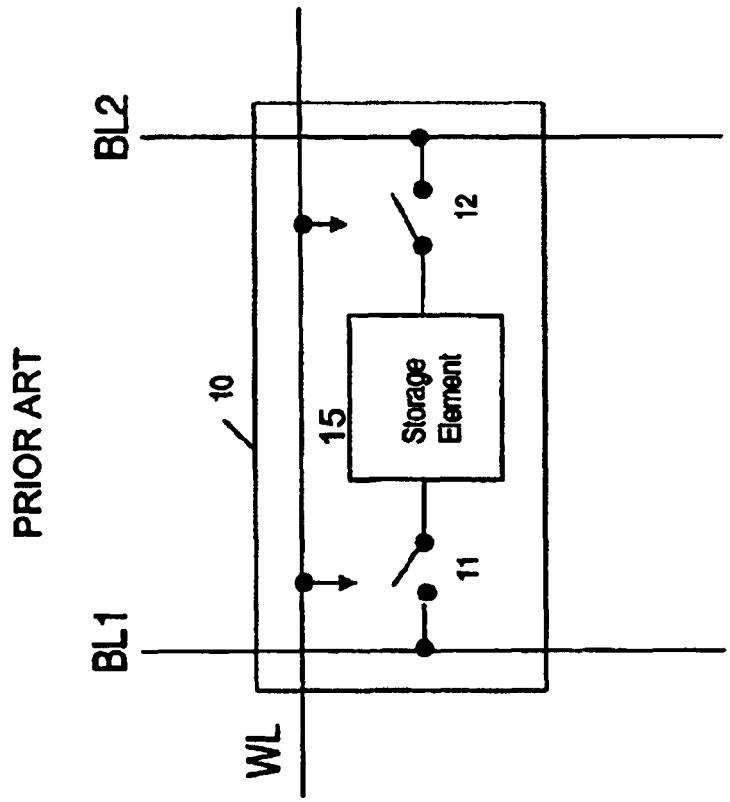
FIG. 1B is a functional representation of the prior art SRAM cell shown in FIG. 1A consisting of one storage element and two switches.
Figure 1A:
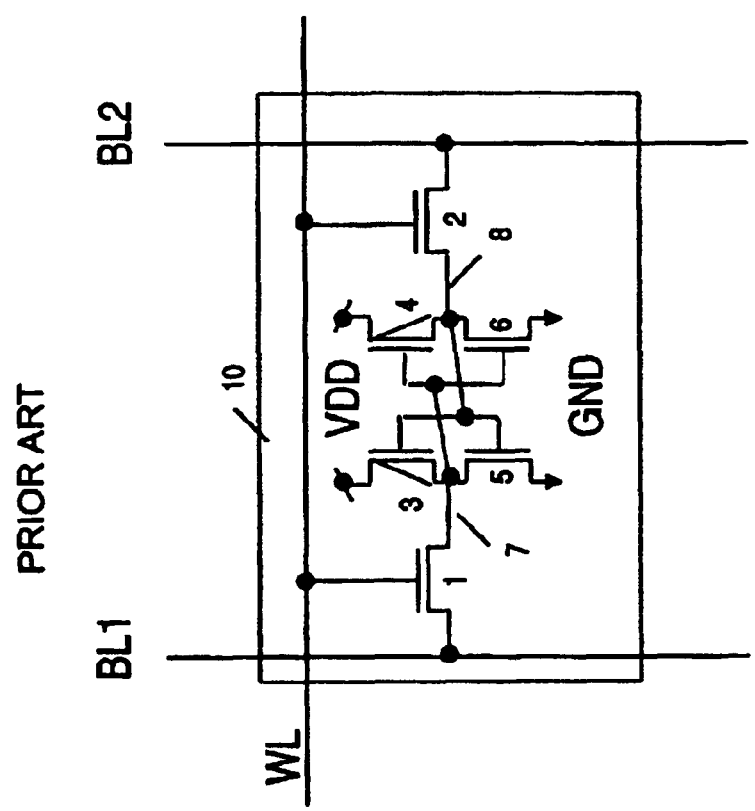
FIG. 1A is a transistor level schematic showing a prior art 6T SRAM cell.
Figure 2B:
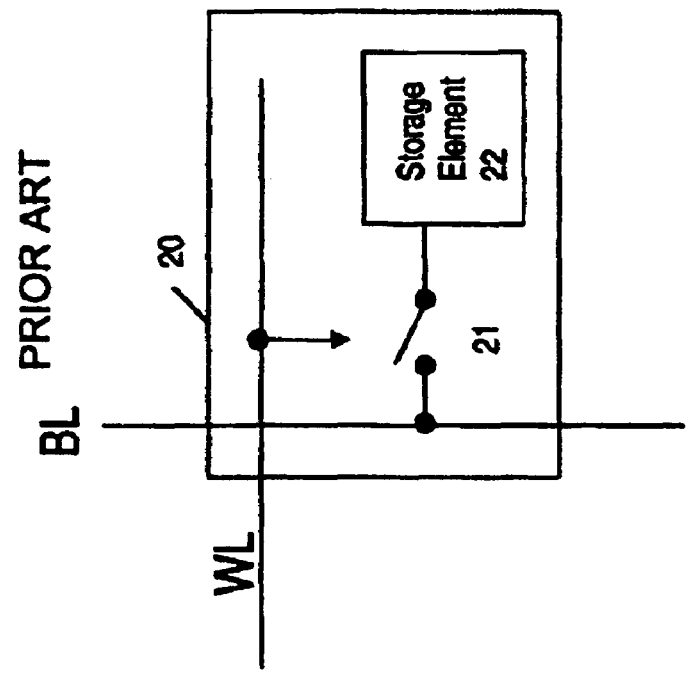
FIGS. 2A and 2B are, respectively, a transistor level schematic and a functional representation of a prior art single-ended DRAM cell.
Figure 2A:
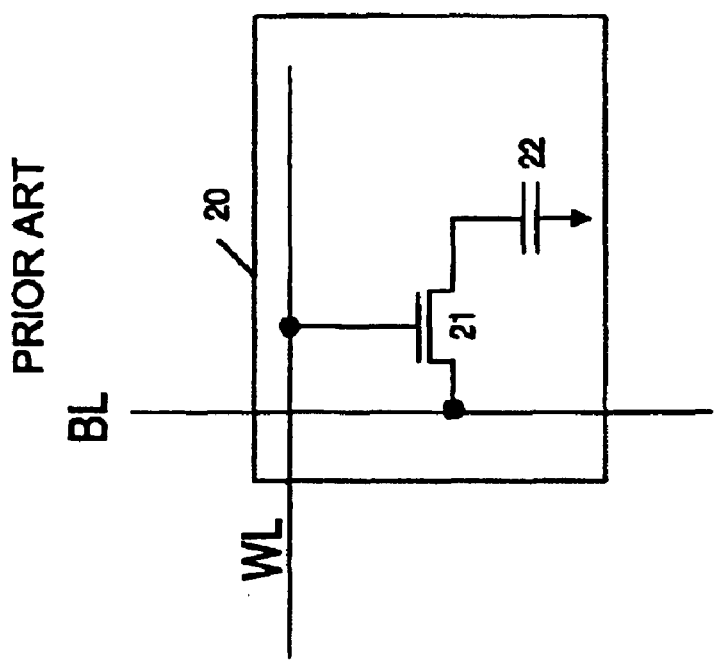
Figure 3A:
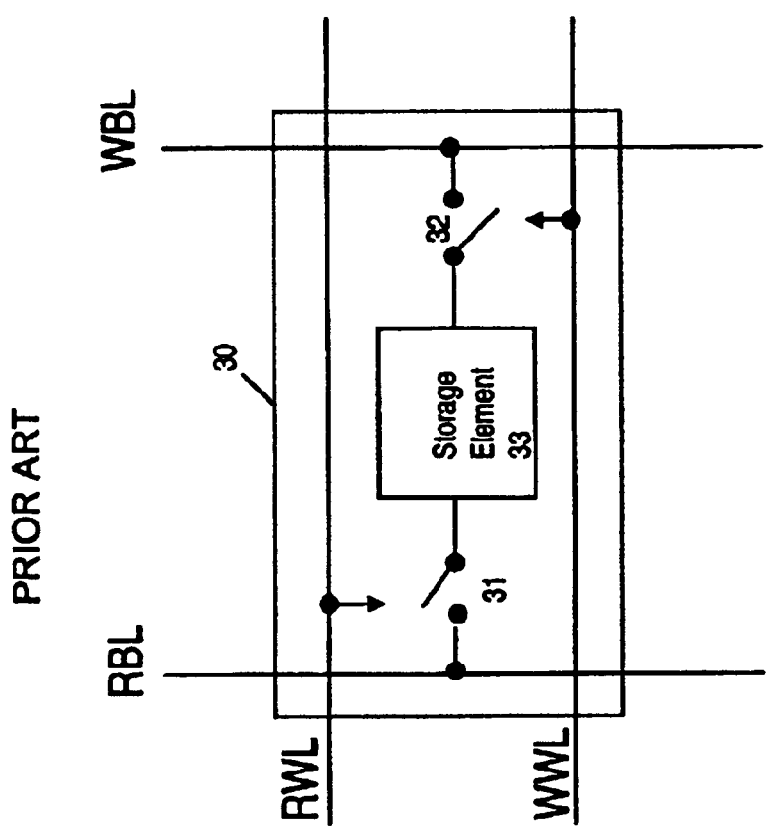
FIG. 3A is a schematic diagram of a prior art single-ended multi-port destructive write memory cell consisting of a storage element and two switches.

For the destructive read and destructive write multi-port memory cell shown in FIG. 3D, VDD or ½VDD BL precharged voltage is preferably chosen. This allows a destructive read operation to be a preconditioning write operation at VDD or ½VDD. It also results in a faster write operation for the following write operation, further improving the write cycle time.

While the invention has been described in terms of a preferred embodiment, various alternative and modifications can be devised by those skilled in the art without departing from the invention. Accordingly, the present invention is intended to embrace all such alternatives which fall within the scope of the appended claims.

What is claimed is:

1. A memory array comprising:
a plurality of single-ended, dual-port, destructive-write memory cells arranged in an array formation of rows and columns, each cell having a read port consisting of a read data terminal and a read activation terminal, and further a write port consisting of a write data terminal and a write activation terminal, the read data terminal being accessed by asserting the cell read activation terminal and the write data terminal being accessed by asserting the cell write activation terminal,
wherein in each column of cells, a read bitline connects all the read data terminals of each cell, each read bitline having a read sense amplifier connected thereto, and a write bitline with an associated write data driver connected to the write data terminal of the memory cells, and
wherein when the read activation terminal is asserted, the read data terminal presents data depending upon the stored content of the memory cell, and when the write activation terminal is asserted, the content of the memory cell is set according to the state of the write data terminal; and
a circuit associated with each of the read sense amplifiers and each of the write data drivers for holding data sensed by the read sensing amplifier, making data read by the read sense amplifier available to the write data driver.

2. The memory array as recited in claim 1, wherein depending on electrical signals generated outside the memory array, the circuit combines data read out from the read sense amplifier and data received from outside the memory assay to make it available to the write data driver.

3. The memory array as recited in claim 2, wherein the read and write wordlines are asserted by a wordline decoder and by corresponding write data drivers, and wherein one read wordline and one write wordline are asserted simultaneously for different cells of the memory array.

4. The memory array as recited in claim 2, wherein the circuit associated with each read sense amplifier and write data driver holds data sensed by the read sensing amplifier, providing a means for allowing data read-out of the array during one cycle to be modified and written-back to the memory array concurrently with the read-out operation of the next memory cycle.

5. The memory array as recited in claim 4, wherein the write cycle consists of ready-out and write-back phases.

6. The memory array as recited in claim 2 wherein selected bits of the data read-out are modified by input data provided from outside the memory array before being written-back during a write cycle.

7. The memory array as recited in claim 2 further comprises an output data terminal wherein selected bits of the read-out data are outputted to outside the memory array.

8. The memory array as recited in claim 7, wherein the columns to be read out of the memory array and written into the memory array are selected by a column decoder.

9. The memory array as recited in claim 8, wherein the column decoder activates a column read switch which connects selected read sense amplifiers to the output terminal of the memory array.

10. The memory array as recited in claim 8, wherein the column decoder activates a column write switch connecting the memory input port to the write data drivers allowing the selected write data to override data from the read sense amplifier.

11. The memory array as recited in claim 10, wherein activation of the column write switch is triggered by the delayed clock.

12. The memory array as recited in claim 2, wherein the write wordline circuit is a latch connected to a driver.

13. The memory array as recited in claim 2, wherein the write wordline is activated by a delayed clock.

14. The memory array as recited in claim 2, wherein circuit elements connect each read sense amplifier to a corresponding write data driver to provide means for refreshing the memory cells.

15. The memory array as recited in claim 2, wherein a circuit is provided with each row decoder circuit to activate corresponding write wordlines during the write-back phase of a cycle occurring concurrently with the activation of a read wordline.

16. The memory array as recited in claim 2, further comprising an address match detection means for detecting when a write cycle is immediately followed by a read cycle at the same address, wherein during a pipelined operation, the read cycle overlaps with a previous write cycle, and wherein when addresses of two operations coincide, input data associated with a write operation and modified by logic operations associated with the latch and the multiplexer is delivered to the memory array output data port.

17. The memory array as recited in claim 2, wherein the sense amplifiers are single-ended, current mode sense amplifier.

18. The memory array as recited in claim 2, wherein the sense amplifiers are differential amplifiers.

19. The memory array as recited in claim 2, wherein a pipeline operation is controlled by at least one clock.

20. The memory array as recited in claim 2, wherein the memory cells are selected from the group of cells consisting of 3-transistors and 1-capacitor (3T 1C); 2-transistors and 1-capacitor (2T 1C); and 1-capacitor (1T 1C).

21. The memory array as recited in claim 1, wherein the write wordlines are coupled to the write activation terminals of the memory cells, the write wordlines being positioned orthogonally to the read and write bitlines, and wherein the plurality of read wordlines are connected to the read activation terminals of the memory cells and positioned orthogonally to the read and write bitlines.

22. The memory array as recited in claim 1, wherein the memory cells are read-out non-destructively.

23. The memory array as recited in claim 1, wherein the memory cells are read-out destructively.

* * * * *